US012586642B2

(12) United States Patent
Zhang et al.

(10) Patent No.: US 12,586,642 B2
(45) Date of Patent: Mar. 24, 2026

(54) MECHANISMS FOR PROGRAMMING MULTILEVEL MEMORY DEVICES WITH VARIABLE MEMORY WINDOWS

(71) Applicant: TetraMem Inc., Fremont, CA (US)

(72) Inventors: Minxian Zhang, Amherst, MA (US); Mingche Wu, San Jose, CA (US); Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 9 days.

(21) Appl. No.: 18/732,597

(22) Filed: Jun. 3, 2024

(65) Prior Publication Data

US 2025/0372164 A1      Dec. 4, 2025

(51) Int. Cl.
*G11C 14/00* (2006.01)
*G11C 13/00* (2006.01)
(52) U.S. Cl.
CPC ...... *G11C 13/0069* (2013.01); *G11C 13/0064* (2013.01)

(58) Field of Classification Search
CPC .................................................. G11C 14/0045
See application file for complete search history.

(56) References Cited

U.S. PATENT DOCUMENTS

2022/0076746 A1 *    3/2022    Gao ........................ G06N 3/065

* cited by examiner

*Primary Examiner* — Hoai V Ho
(74) *Attorney, Agent, or Firm* — Jaffery Watson Hamilton & DeSanctis LLP

(57) ABSTRACT
The present disclosure provides methods for programming multilevel memory devices. The methods may include determining a first plurality of memory windows representative of gaps between dispersions of adjacent conductance states of the memory device, determining a plurality of dispersion parameters representative of estimated dispersions of the conductance states, and determining a second plurality of memory windows based on the first plurality of memory windows and the plurality of dispersion parameters. The second plurality of memory windows represents separations between mean conductance values of adjacent conductance states of the memory device. The second plurality of memory windows has varying values.

20 Claims, 7 Drawing Sheets

300a

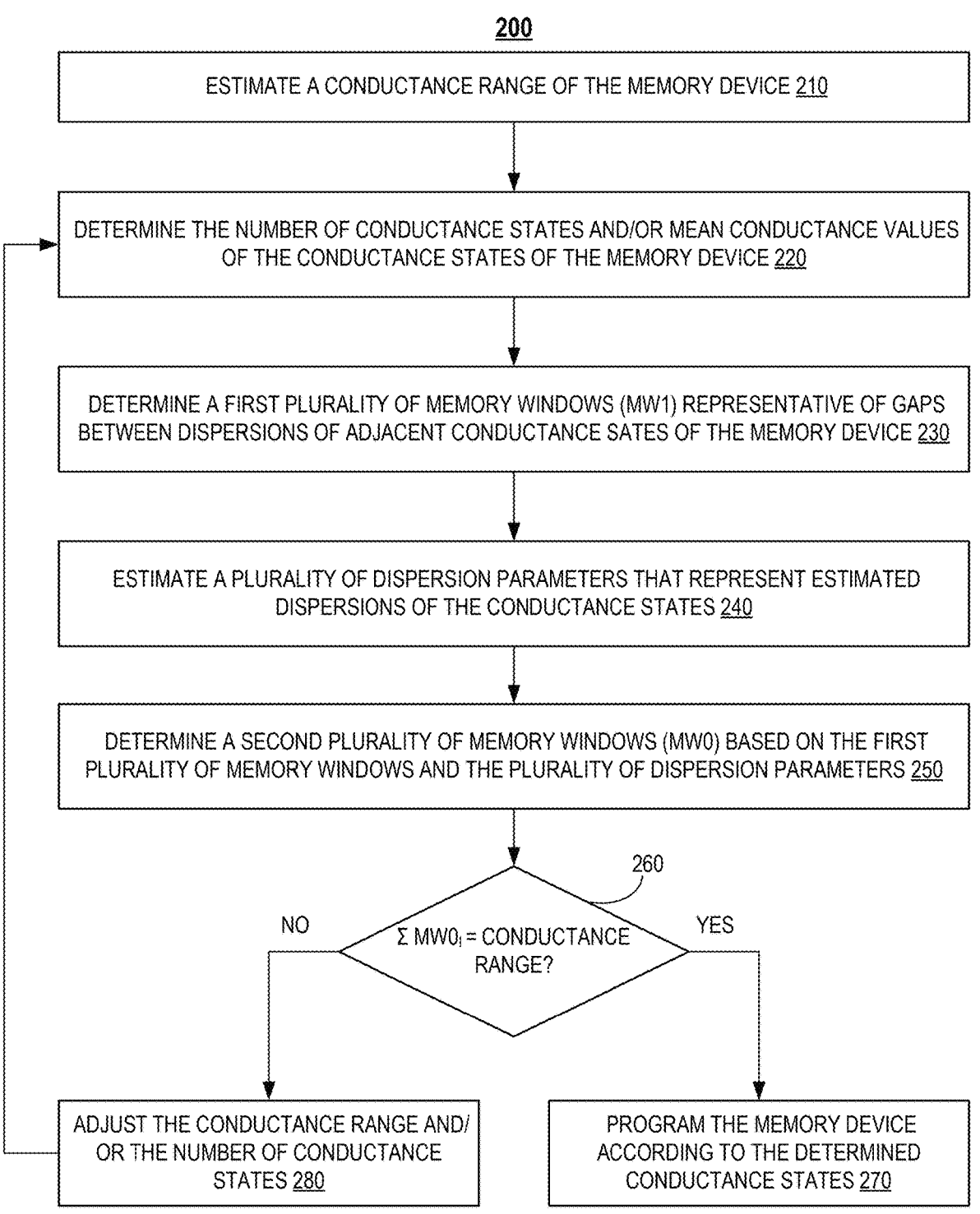

<u>200</u>

ESTIMATE A CONDUCTANCE RANGE OF THE MEMORY DEVICE <u>210</u>

DETERMINE THE NUMBER OF CONDUCTANCE STATES AND/OR MEAN CONDUCTANCE VALUES OF THE CONDUCTANCE STATES OF THE MEMORY DEVICE <u>220</u>

DETERMINE A FIRST PLURALITY OF MEMORY WINDOWS (MW1) REPRESENTATIVE OF GAPS BETWEEN DISPERSIONS OF ADJACENT CONDUCTANCE SATES OF THE MEMORY DEVICE <u>230</u>

ESTIMATE A PLURALITY OF DISPERSION PARAMETERS THAT REPRESENT ESTIMATED DISPERSIONS OF THE CONDUCTANCE STATES <u>240</u>

DETERMINE A SECOND PLURALITY OF MEMORY WINDOWS (MW0) BASED ON THE FIRST PLURALITY OF MEMORY WINDOWS AND THE PLURALITY OF DISPERSION PARAMETERS <u>250</u>

260

NO   $\Sigma MW0_i$ = CONDUCTANCE RANGE?   YES

ADJUST THE CONDUCTANCE RANGE AND/ OR THE NUMBER OF CONDUCTANCE STATES <u>280</u>

PROGRAM THE MEMORY DEVICE ACCORDING TO THE DETERMINED CONDUCTANCE STATES <u>270</u>

| Adjacent States | 1 - 2 | 2 - 3 | 3 - 4 |
|---|---|---|---|
| MW0, µS | 50 | 50 | 50 |
| MW1, µS | 0.74 | 15.94 | 27.45 |

| Adjacent States | 1 - 2 | 2 - 3 | 3 - 4 |
|---|---|---|---|
| MW0, µS | 60 | 50 | 40 |
| MW1, µS | 11.85 | 17.75 | 18.15 |

FIG. 5B

MECHANISMS FOR PROGRAMMING MULTILEVEL MEMORY DEVICES WITH VARIABLE MEMORY WINDOWS

TECHNICAL FIELD

The implementations of the disclosure relate generally to electronic devices and, more specifically, to schemes for programming multilevel memory devices with variable memory windows, such as resistive random-access memory (RRAM or ReRAM) devices.

BACKGROUND

A multilevel memory device, such as a multilevel RRAM device, may operate at multiple conductance states. The conductance states may be defined using probability distribution functions (e.g., a probability density function (PDF), cumulative distribution functions (CDF), etc.) of conductance values. This capability enables the encoding of multiple memory states within a single cell, significantly increasing the data storage density by allowing each cell to store more than one bit of information.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, methods for programming a multilevel memory device are provided. The methods include: determining a first plurality of memory windows representative of gaps between dispersions of adjacent conductance states of the multilevel memory device; determining, by a processing device, a plurality of dispersion parameters representative of estimated dispersions of the conductance states; and determining, by the processing device, a second plurality of memory windows based on the first plurality of memory windows and the plurality of dispersion parameters. A first memory window of the second plurality of memory windows represents a separation between a mean conductance value of a first conductance state of the multilevel memory device and a mean conductance value of a second conductance state of the multilevel memory device. A second memory window of the second plurality of memory windows represents a separation between a mean conductance value of a third conductance state and a mean value of a fourth conductance state of the multilevel memory device. The first memory window and the second memory window are of different values.

In some embodiments, the first plurality of memory windows includes a third memory window corresponding to a first gap between a first dispersion of the first conductance state and a second dispersion of the second conductance state of the multilevel memory device. The first memory window is determined based on the third memory window, a first dispersion parameter representative of an estimated dispersion of the first conductance state, and a second dispersion parameter representative of an estimated dispersion of the second conductance state.

In some embodiments, determining the plurality of dispersion parameters includes determining the first dispersion parameter by predicting a first deviation value representative of variability of conductance values of the first conductance state and determining a scaled value of the first deviation value.

In some embodiments, determining the plurality of dispersion parameters includes determining the second dispersion parameter by predicting a second deviation value representative of variability of conductance values of the second conductance state and determining a scaled value of the second deviation value.

In some embodiments, predicting the first deviation value includes extrapolation of historical retention data using linear regression.

In some embodiments, the first plurality of memory windows includes a fourth memory window corresponding to a second gap between a third dispersion of the third conductance state and a fourth dispersion of the fourth conductance state of the multilevel memory device, wherein the second memory window is determined based on the fourth memory window, a third dispersion parameter representative of an estimated dispersion of the third conductance state, and a fourth dispersion parameter representative of an estimated dispersion of the fourth conductance state.

In some embodiments, the methods further include comparing a sum of the second plurality of memory windows with a conductance range of the multilevel memory device and adjusting, by the processing device, at least one of the conductance range or the number of the conductance states based on the comparison.

In some embodiments, adjusting the number of conductance states based on the comparison includes increasing the number of conductance states in response to determining that the sum of the second plurality of memory windows is less than the conductance range.

In some embodiments, adjusting the number of conductance states based on the comparison includes decreasing the number of conductance states in response to determining that the sum of the second plurality of memory windows is greater than the conductance range.

In some embodiments, the methods further include programming the multilevel memory device according to the conductance states in response to determining that a difference between the sum of the second plurality of memory windows and the conductance range of the memory device is not greater than a predetermined threshold.

According to one or more aspects of the present disclosure, a crossbar circuit is provided. The crossbar circuit includes: a plurality of interconnecting electrically conductive lines; at least one memory device connected to the electrically conductive lines; and a controller. The controller is configured to: determine a first plurality of memory windows representative of gaps between adjacent conductance state dispersions of the memory device; determine a plurality of dispersion parameters representative of estimated dispersions of the conductance states; and determine a second plurality of memory windows based on the first plurality of memory windows and the plurality of dispersion parameters. A first memory window of the second plurality of memory windows represents a separation between a mean conductance value of a first conductance state of the memory device and a mean conductance value of a second conductance state of the memory device. A second memory window of the second plurality of memory windows represents a separation between a mean conductance value of a third conductance state and a mean value of a fourth conductance state of the memory device. The first memory window and the second memory window are of different values.

In some embodiments, the first plurality of memory windows includes a third memory window corresponding to a first gap between a first dispersion of the first conductance state and a second dispersion of the second conductance state of the memory device, wherein the first memory window is determined based on the third memory window, a first dispersion parameter representative of an estimated dispersion of the first conductance state, and a second dispersion parameter representative of an estimated dispersion of the second conductance state.

In some embodiments, to determine the plurality of dispersion parameters, the controller is further to determine the first dispersion parameter by predicting a first deviation value representative of variability of conductance values of the first conductance state and determining a scaled value of the first deviation value.

In some embodiments, to determine the plurality of dispersion parameters, the controller is further to determine the second dispersion parameter by predicting a second deviation value representative of variability of conductance values of the second conductance state and determining a scaled value of the second deviation value.

In some embodiments, to predict the first deviation value, the controller is to perform extrapolation of historical retention data using linear regression.

In some embodiments, the first plurality of memory windows includes a fourth memory window corresponding to a second gap between a third dispersion of the third conductance state and a fourth dispersion of the fourth conductance state of the memory device, wherein the second memory window is determined based on the fourth memory window, a third dispersion parameter representative of an estimated dispersion of the third conductance state, and a fourth dispersion parameter representative of an estimated dispersion of the fourth conductance state.

In some embodiments, the controller is further to compare a sum of the second plurality of memory windows with a conductance range of the memory device and adjust at least one of the conductance range or the number of the conductance states based on the comparison.

In some embodiments, to adjust the number of the conductance states based on the comparison, the controller is further to increase the number of conductance states in response to determining that the sum of the second plurality of memory windows is less than the conductance range.

In some embodiments, to adjust the number of the conductance states based on the comparison, the controller is further to decrease the number of conductance states in response to determining that the sum of the second plurality of memory windows is greater than the conductance range.

In some embodiments, the memory device includes at least one of a phase-change memory (PCM) device, a floating gate device, a spintronic device, a ferroelectric device, or a resistive random-access memory (RRAM or ReRAM) device.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIG. 2 is a flow chart illustrating an example process for programming a multi-level memory device in accordance with some embodiments of the present disclosure.

FIG. 5A depicts a table showing memory windows between adjacent conductance states of a prior art RRAM device.

FIG. 5B is a table illustrating memory windows between adjacent conductance states of a memory device with variable memory windows in accordance with some embodiments of the present disclosure.

DETAILED DESCRIPTION

Figure 1:
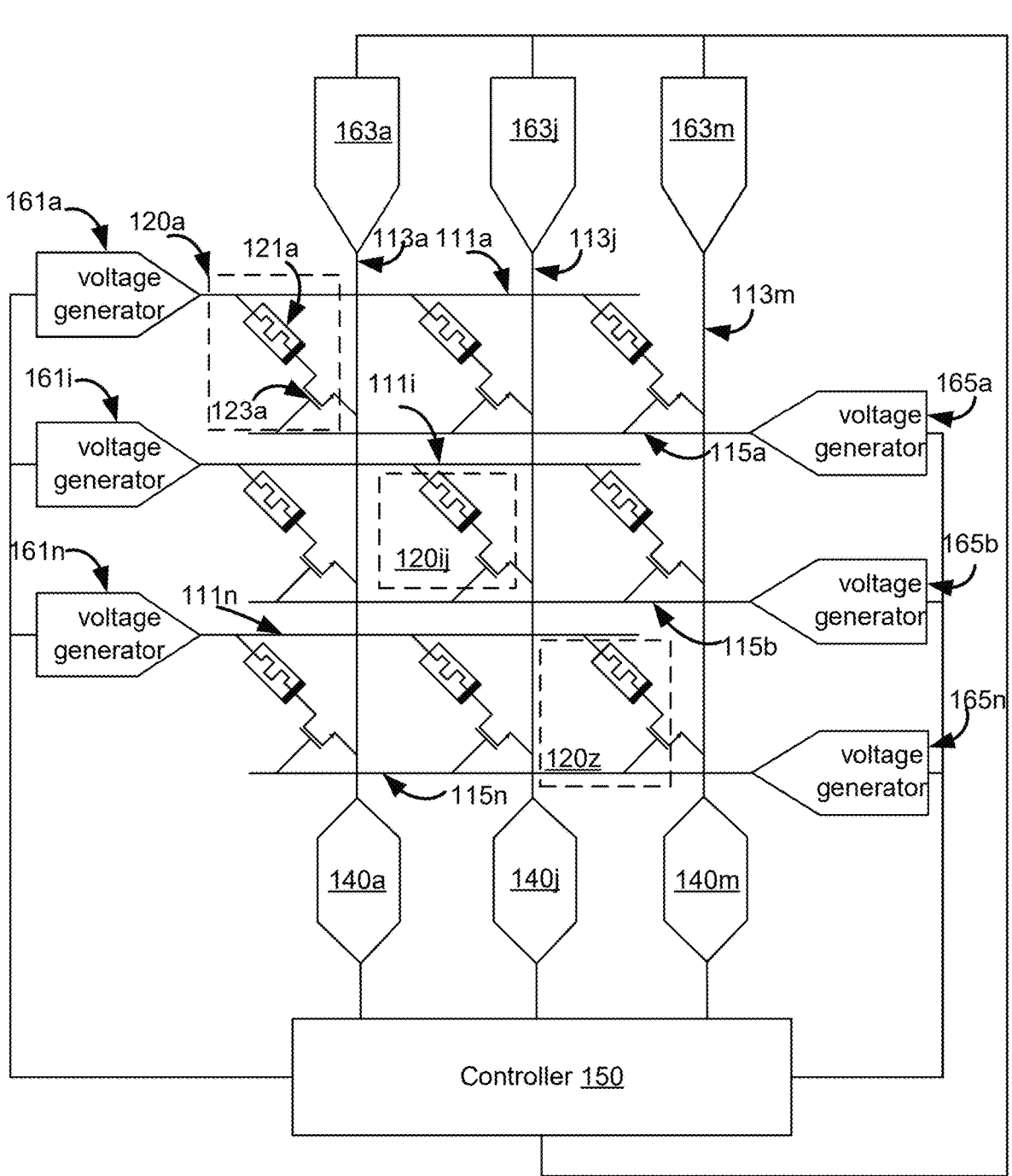
FIG. 1 is a diagram illustrating an example crossbar circuit in accordance with some embodiments of the present disclosure.

Aspects of the disclosure provide multilevel memory devices with variable memory windows. A multilevel memory device, such as a multilevel RRAM device, may operate at multiple conductance states, enabling multiple memory states and allowing the memory device to store more than one bit of information per cell. Each conductance state may be defined using a probability distribution function (e.g., a probability density function (PDF), a cumulative distribution function (CDF), etc.) of conductance values. The conductance states may further be defined by two types of memory windows (MW), i.e., a separation between the mean conductance values of two adjacent conductance states (also referred to as "$MW0_{i\text{-}i+1}$" with i and i+1 indicating the two adjacent memory states, and 0 indicating the memory window between the two means of adjacent conductive states, i and i+1), and a separation between the highest conductance value of a conductance state i and the lowest conductance value of an adjacent conductance state i+1 (also referred to as "$MW1_{i\text{-}i+1}$", with 1 indicating a gap between the two tails of the adjacent conductive states i and i+1"). A sufficient $MW1_{i\text{-}i+1}$ between two adjacent conductance states is required to achieve distinguishable memory states. The values of $MW1_{i\text{-}i+1}$ can be varied in a range depending on the multilevel memory device applications, i.e., $MW1_{i\text{-}i+1}$ can be increased for more critical applications and can be decreased for more tolerable applications. The device may be deemed a failure if $MW1_{i\text{-}i+1}$ vanishes during its operation in memory or computing applications.

It might be desirable to program the memory device to more conductance states to increase the memory states of the device and enhance the data storage density of the memory device. However, adding more memory levels involves incorporating additional memory states within the device's available conductance range, leading to smaller memory windows and increasing the risk of retention failure. Conversely, larger MWs create greater separation between adjacent memory states, which enhances memory state retention but reduces the total number of memory states in the device. This tradeoff is crucial for the implementation of multilevel memory.

Accordingly, the present disclosure provides mechanisms for programming and operating memory devices (e.g., RRAM devices) with variable memory windows to achieve more memory levels with good memory retention. In particular, a large memory window may be assigned to a low-conductance state that is associated with a high variability of conductance values (e.g., a high standard deviation of a PDF representing the low conductance state), while a smaller memory window may be assigned to a high-conductance state with a low variability of conductance values (e.g., a low standard deviation of a PDF representing the high conductance state). The variable memory windows may enable adequate memory windows (MW0) between adjacent conductance states and may achieve good retention and more memory states in a given conductance range. The application of the variable memory windows is an optimal tradeoff between more memory states and good memory retentions.

FIG. 1 is a diagram illustrating an example crossbar circuit 100 in accordance with some embodiments of the present disclosure. As shown, crossbar circuit 100 may include a plurality of interconnecting electrically conductive wires, such as one or more row wires 111a, . . . , 111i, . . . , 111n, and column wires 113a, . . . , 113j, . . . , 113m for an n-row by m-column crossbar array. The crossbar circuit 100 may further include memory devices 120a, . . . , 120ij, . . . , 120z, etc. The number of the column wires 113a-m and the number of the row wires 111a-n may or may not be the same. Crossbar circuit 100 may further include select lines 115a, 115b, . . . , 115n. Each of the memory devices may connect a row wire, a column wire, and a select line. For example, the memory device 120ij may connect the row wire 111i, the column wire 113j, and the select line 115b. Each of the row wires 111a-n, column wires 113a-m, and select lines 115a-n may be a conductive wire. In some embodiments, each row wire 111a-n may be a word line, and each column wire 113a-m may be a bit line. In some embodiments, each row wire 111a-n may be a bit line, and each column wire 113a-m may be a word line.

Crossbar circuit 100 may further include one or more voltage generators 161a, 161i, . . . , 161n connected to the row wires 111a-n, voltage generators 163a, 163j, . . . , 163m connected to the column wires 113a-m, voltage generators 165a, 165b, . . . , 165n connected to the select lines 115a-n. Each voltage generator 161a-n, 163a-m, and 165a-n may include any suitable component for generating and providing voltage signals. A voltage generator 161a, 161i, . . . , 161n may apply voltages to one or more memory devices 120a-z via a respective row wire 111a-n. A voltage generator 163a, 163j, . . . , 163m may apply voltages to one or more memory devices 120a-z via a respective column wire 113a-m. A voltage generator 165a, 165b, . . . , 165n may apply voltages to one or more memory devices 120a-z via a respective select line 115a-n.

Each memory device 120a-z may be and/or include any suitable device with programmable resistance, such as phase-change memory (PCM) devices, floating gate devices, spintronic devices, ferroelectric devices, resistive random-access memory (RRAM or ReRAM) devices, etc. Each memory device 120a-z may operate at a plurality of conductance states as described in connection with FIGS. 3A-3B. Each memory device 120a-z MAY be programmed to a suitable conductance value by applying suitable programming signals (e.g., suitable voltage signals or current signals) across the memory device. The resistance of each memory device may be electrically switched between a high-resistance state and a low-resistance state. Setting a memory device may involve switching the resistance of the cross-point from the high-resistance state to the low-resistance state. Resetting the memory device may involve switching the resistance of the cross-point from the low-resistance state to the high-resistance state.

In some embodiments, one or more memory devices 120a-z may include a one-transistor-one-resistor (1T1R). For example, as shown in FIG. 1, a memory device 120a may include an RRAM device 121a and a transistor 123a that are connected in series. Transistor 123a May provide access control for RRAM device 121a. The transistor may include a gate terminal, a source terminal, and a drain terminal. In some embodiments, a first terminal of RRAM device 121a may be connected to the drain of transistor 123a. A second terminal of RRAM device 121a may be connected to row wire 111a. The source terminal of transistor 123a may be connected to column wire 113a. The gate terminal of transistor 123a may be connected to select line 115a. In one implementation, row wire 111a and column wire 113a may be a word line and a bit line, respectively. In another implementation, row wire 111a and column wire 113a may be a bit line and a word line, respectively.

Transistor 123a may function as a selector as well as a current controller and may set the current compliance to RRAM device 121a during the programming of RRAM device 121a. The gate voltage on transistor 123a can set current compliances to memory device 121a during programming and can thus control the conductance and analog behavior of memory device 120a. For example, when memory device 120a and/or RRAM device 121a is set from a high-resistance state to a low-resistance state, a set signal (e.g., a voltage signal, a current signal) may be provided via row wire 111a (or column wire 113a). Another voltage, also referred to as a select voltage or gate voltage, may be applied via select line 115a to the transistor gate of transistor 123a to open the gate and set the current compliance, while column wire 113a (or row wire 111a) may be grounded. When memory device 120a and/or RRAM device 121a is reset from the low-resistance state to the high-resistance state, a gate voltage may be applied to the gate of transistor 123a via select line 115a to open the transistor gate. Meanwhile, a reset signal may be applied to RRAM device 121a via column wire 113a (or row wire 111a), while row wire 111a (or column wire 113a) may be grounded. The set voltage and the reset voltage may have the same or different polarities.

Output circuits 140a, 140j, . . . , 140m may include any suitable circuitry for converting the current flowing through a respective column wire 113a, 113j, . . . , 113m into an output signal. For example, each output circuit 140a-m may include a trans-impedance amplifier (TIA) (not shown) that may convert the current flowing through a respective column wire into a respective voltage signal. Each output circuit 140a-m may further include an analog-to-digital converter (ADC) (not shown) that may convert the voltage signal produced by its corresponding TIA into a digital output.

Crossbar circuit 100 may perform parallel weighted voltage multiplication and current summation. For example, an input voltage signal may be applied to one or more rows of crossbar circuit 100 (e.g., one or more selected rows). The input signal may flow through the memory devices of the rows of the crossbar circuit 100. The conductance of the memory device may be tuned to a specific value (also referred to as a "weight"). By Ohm's law, the input voltage multiplies the cross-point conductance and generates a current from the memory device. By Kirchhoff's law, the sum of the currents passes through the activated memory devices on a respective column (also referred to as the "bit line current"), which may be read from the column. According to Ohm's law and Kirchhoff's current law, the input-output relationship of the crossbar array can be represented as I=VG, wherein I represents the output signal matrix as current; V represents the input signal matrix as voltage; and G represents the conductance matrix of the memory devices. As such, the input signal is weighted at each of the memory devices by its conductance according to Ohm's law. The weighted current (the "bit line current") is output via each column wire and may be accumulated according to Kirchhoff's current law. This may enable in-memory computing (IMC) via parallel multiplications and summations performed in the crossbar arrays.

Crossbar circuit 100 may be configured to perform vector-matrix multiplication (VMM). A VMM operation may be represented as Y=XA, wherein each of Y, X, A represents a respective matrix. More particularly, for example, input vector X may be mapped to the input voltage V of crossbar circuit 100. Matrix A may be mapped to conductance values G. The output current I may be read and mapped back to output results Y. In some embodiments, crossbar circuit 100 may be configured to implement a portion of a neural network by performing VMMs.

Controller 150 may include any suitable hardware and/or software components for implementing the schemes for programming multilevel memory devices as described herein. In particular, controller 150 may program memory devices 120a-z at multiple conductance states by executing process 200 of FIG. 2. In some embodiments, controller 150 may include a processing device as described in connection with FIG. 6 below. Controller 150 may be and/or include a computer system 600 of FIG. 6. In one implementation, controller 150 may be implemented as a stand-alone device that is not part of crossbar circuit 100. In another implementation, controller 150 may be regarded as part of crossbar circuit 100.

FIG. 2 is a flow chart illustrating an example process 200 for programming a multi-level memory device in accordance with some embodiments of the present disclosure. Process 200 may be executed by a controller as described in connection with FIG. 1 and/or a processing device of FIG. 6.

As shown, process 200 may start at block 210, where a conductance range of the memory device may be estimated. The conductance range may represent a range of conductance values of the memory device during its operations. The conductance range may be estimated according to various factors, such as memristor capabilities, transistor capabilities, drive circuit capabilities, operational requirements (switching energy, speed, etc.), etc.

At block 220, the number of conductance states and/or mean conductance values of the conductance states of the memory device may be determined. Each of the conductance states may be defined by a probability distribution of conductance values of the RRAM device, with a mean conductance value representing the center of the probability distribution. In some embodiments, each of the conductance states may be defined using a probability density function (PDF) of conductance values, a cumulative distribution function (CDF) of conductance values, etc. The number of the conductance states (e.g., four, eight, 16, etc.) and/or the mean conductance values of the RRAM devices may be determined based on the specific application that the RRAM device is to be used. For example, the RRAM device may operate as a 4-level memory device in a conductance range of 30 μS to 180 μS, with four conductance states centering at 30 μS, 80 μS, 130 μS, and 180 μS, respectively, with equal memory windows of 50 μS between the conductance states. At this stage, the distributions and variations for different conductance states may not be well-established, and equal memory windows may be used as an initial set of memory windows.

At block 230, a processing device may determine a first plurality of memory windows representative of gaps between dispersions of adjacent conductance states of the memory device. Each of the first plurality of memory windows may represent a gap (e.g., a distance or separation) between a conductance state's highest conductance value and an adjacent conductance state's lowest conductance value. For example, the conductance states of the memory device may include a first conductance state, a second conductance state, a third conductance state, a fourth conductance state, etc., where the first conductance state and the second conductance state are adjacent, and the third conductance state and the fourth conductance state are adjacent. A memory window $MW1_{1-2}$ shown in FIG. 3A corresponds to the gap between the highest conductance value of the first conductance state and the lowest conductance value of the second conductance state (a gap between a first dispersion of the first conductance state and a second dispersion of the second conductance state). Similarly, a memory window $MW1_{3-4}$ shown in FIG. 3A may be determined. The memory window $MW1_{3-4}$ may correspond to the gap between the highest conductance value of the third conductance state and the lowest conductance value of the fourth conductance state (a gap between a third dispersion of the third conductance state and a fourth dispersion of the fourth conductance state). The first plurality of memory windows may be predefined desirable or required gaps between adjacent conductance states after retention.

At block 240, the processing device may estimate a plurality of dispersion parameters that represent estimated dispersions of the conductance states. Each dispersion parameter may be determined by estimating and/or predicting a deviation value (e.g., σ) that measures the variability of conductance values around the mean conductance value of a conductance state, determining a factor (e.g., based on the specific applications for which the memory device is to be used), and calculating a scaled value of the deviation value (e.g., multiplying the deviation by the factor). The deviation value can be estimated by performing linear regression analysis on historical retention data of the RRAM device, obtained at a particular temperature over a first period of time, and extrapolating this data to predict the deviation value over a second period of time at the same temperature, assuming the same failure mode persists from the first period of time to the second period of time. This may involve evaluating past performance data of the memory system to determine the rate of change (slope) and the initial condition (intercept) of the deviation values over time. The temperature may represent a high temperature that simulates the worst operating scenario for the RRAM device or is used in an accelerated lift test (ALT).

For example, the processing device may predict a first deviation value, a second deviation value, a third deviation value, and a fourth deviation value for the first conductance state, the second conductance state, the third conductance state, and the fourth conductance state, respectively. Each of the predicted deviation values represents the variability of conductance values around the mean conductance value of the RRAM device for a given conductance state after operating for a second period (e.g., 10 years) and may be determined based on historical retention data that indicates variability when the device operated during a first period. In some embodiments, as will be described in further detail in connection with FIGS. 4A-4B, the deviation value of each conductance state may be predicted using a logarithmic model where sigma is expressed as a function of the natural logarithm of time. These predictions are made for the first conductance state, the second conductance state, the third conductance state, and the fourth conductance state, respectively.

The factor used in scaling may be determined based on specific application requirements. For example, a relatively low BER (bit error rate), such as in the PPM (parts per million) range, may be required for multi-level memory applications. As another example, a relatively high BER, such as in the percentage range, may be used for multi-level memory used for in-memory computing (IMC) applications. The estimated deviation values are then scaled (by multiplying the deviation values with the factor, such as three, five, etc.) to obtain the dispersion parameters (e.g., 36, 56). In particular, the first dispersion parameter, the second dispersion parameter, the third dispersion parameter, and a fourth dispersion parameter may be calculated by scaling the first deviation value, the second deviation value, the third deviation value, and the fourth deviation value, using the factor, respectively. As an example, the RRAM device may operate with four conductance states centering at 30 µS, 90 µS, 140 µS, and 180 µS, respectively, with variable memory windows, such as 60 µS, 50 µS, and 40 µS, for improved memory retention. The target conductance value (i.e., the mean conductance value), the predicted deviation value over 10 years of the RRAM device's operation at 85° C., and the dispersion parameter for each state are listed in the following table.

TABLE 1

| State | 1 | 2 | 3 | 4 |
| --- | --- | --- | --- | --- |
| Target Conductance, µS | 30 | 90 | 140 | 180 |
| σ, 85° C. 10 years, µS | 5.83 | 3.80 | 2.65 | 1.72 |
| 5σ, 85° C. 10 years, µS | 29.15 | 19.00 | 13.25 | 8.60 |

In the example shown in Table 1, the first deviation value, the second deviation value, the third deviation value, and the fourth deviation value are 5.83 µS, 3.80 µS, 2.65 µS, and 1.72 µS, respectively, the first dispersion parameter, the second dispersion parameter, the third dispersion parameter, and the fourth dispersion parameter are 29.15 µS, 19.00 µS, 13.25 µS, and 8.60 µS, respectively.

At block 250, the processing device may determine a second plurality of memory windows based on the first plurality of memory windows and the plurality of dispersion parameters. The second plurality of memory windows has varying values. Each of the second plurality of memory windows may represent a separation (e.g., a distance) between a conductance state's mean conductance value and its adjacent conductance state's mean conductance value. For example, a memory window $MW0_{1-2}$ between the first conductance state meal value and the second conductance state mean value (also referred to as "a first memory window") may be determined based on a memory window $MW1_{1-2}$ between the first conductance state right tail and the second conductance state left tail (also referred to as "a third memory window"), the first dispersion parameter, and the second dispersion parameter (e.g., by determining a sum of the third memory window, the first dispersion parameter, and the second dispersion parameter). As another example, a memory window $MW0_{3-4}$ between the third conductance state mean and the fourth conductance state mean (also referred to as "a second memory window") may be determined based on a memory window $MW1_{3-4}$ between the third conductance state right tail and the fourth conductance state left tail (also referred to as "a fourth memory window"), the third dispersion parameter, and the fourth dispersion parameter (e.g., by determining a sum of the fourth memory window, the third dispersion parameter, and the fourth dispersion parameter). The first memory window and the second memory window may be of different values.

At block 260, a sum of the second plurality of memory windows may be determined and compared with the conductance range of the RRAM device. In some embodiments in which the sum of the second plurality of memory windows is approximately the same or within the acceptable tolerance as the conductance range, process 200 may proceed to block 270 and may program and/or operate the RRAM device according to the determined conductance states. The sum of the second plurality of memory windows may be regarded as being the same as the conductance range if a difference between the sum of the second plurality of memory windows and the conductance range is not greater than a predetermined threshold.

Alternatively, the processing device may determine that the sum of the second plurality of memory windows is different from the conductance range in some embodiments (e.g., by determining that the difference between the sum of the second plurality of memory windows and the conductance range is greater than the predetermined threshold). In such embodiments, the processing device may adjust the conductance range and/or the number of conductance states based on the comparison of the sum of the second plurality of memory windows with the conductance range at block 280. For example, the processing device may increase the number of conductance states in response to determining that the sum of the second plurality of memory windows is less than the conductance range. The processing device may decrease the number of conductance states and/or increase the conductance range in response to determining that the sum of the second plurality of memory windows is greater than the conductance range.

After executing block 280, process 200 may return to block 220 and may determine the first plurality of memory windows based on the adjusted conductance range and/or the adjusted number of conductance states. Process 200 may be executed in an iterative manner until the sum of the adjusted second plurality of memory windows is the same as the adjusted conductance range.

Figure 3A:
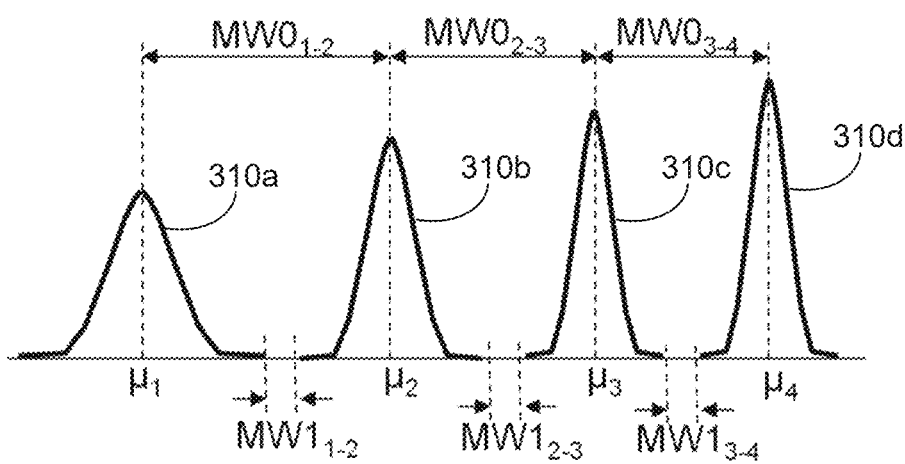
FIGS. 3A and 3B are diagrams illustrating example conductance states and memory windows of an RRAM device in accordance with some embodiments of the present disclosure.
Figure 3B:
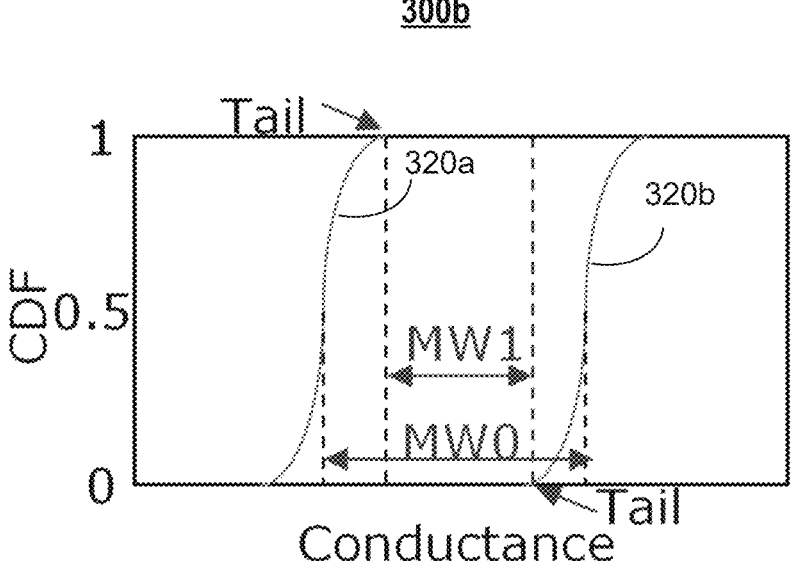

FIGS. 3A and 3B are diagrams 300a and 300b illustrating example conductance states and memory windows of an RRAM device in accordance with some embodiments of the present disclosure.

As shown in FIG. 3A, the RRAM device is a 4-level device that can operate at a first conductance state, a second conductance state, a third conductance state, and a fourth conductance state, respectively. The conductance states may be represented as probability density function (PDF) curves 310a, 310b, 310c, and 310d, respectively. PDF curves 310a, 310b, 310c, and 310d may center at μ1, μ2, μ3, and μ4, respectively. That is, μ1 is the mean conductance value of the first conductance state. μ2 is the mean conductance value of the second conductance state. μ3 is the mean conductance value of the third conductance state. μ4 is the mean conductance value of the fourth conductance state. PDF curves 310a, 310b, 310c, and 310d are defined by μ1, μ2, μ3, μ4, and multiple memory windows. $MW1_{1-2}$ corresponds to a gap between the highest conductance value of the first conductance state and the lowest conductance value of the second conductance state (e.g., a gap between the dispersion of the first conductance state and the dispersion of the second conductance state). $MW1_{2-3}$ corresponds to a gap (e.g., a distance) between the highest conductance value of the second conductance state and the lowest conductance value of the third conductance state (e.g., a gap between the dispersion of the second conductance state and the dispersion of the third conductance state). $MW1_{3-4}$ corresponds to a gap between the highest conductance value of the third conductance state and the lowest conductance value of the fourth conductance state. $MW0_{1-2}$ corresponds to a gap (e.g., a distance or separation) between μ1 and μ2. $MW0_{2-3}$ corresponds to a gap (e.g., a distance or separation) between μ2 and μ3. $MW0_{3-4}$ corresponds to a gap (e.g., a distance or separation) between μ3 and μ4. As shown schematically in FIG. 3A, PDF curves 310a, 310b, 310c, and/or 310d have varying standard deviations. The standard deviation of $MW0_{1-2}$ may be greater than that of $MW0_{3-4}$. As such, a relatively smaller MW0 may be assigned to high conductance states with low standard deviations, while a relatively larger MW0 may be assigned to low conductance states with high standard deviations.

As shown in FIG. 3B, various conductance states of the RRAM device may be defined using CDF curves 320a, 320b, etc. A memory window MW0 refers to the separation between the mean conductance values of the adjacent conductance states. A memory window MW1 refers to the separation or gap between the upper tail of CDF curve 320a and the lower tail of CDF curve 320b of the two adjacent states.

Figure 4A:
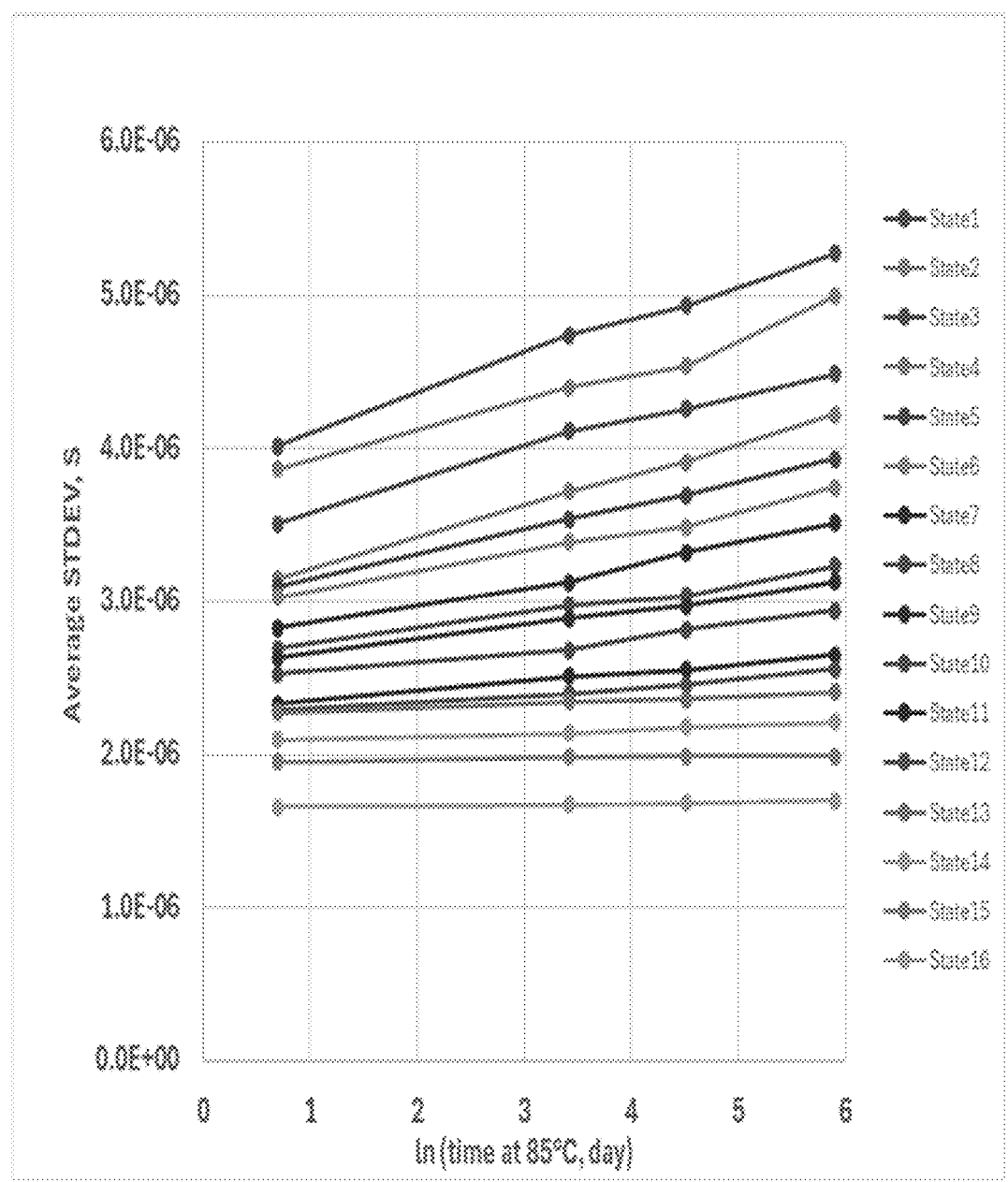
FIG. 4A is a graph 400a illustrating example historical retention data of an RRAM device in accordance with some embodiments of the present disclosure.

FIG. 4A is a graph 400a illustrating example historical retention data of an RRAM device in accordance with some embodiments of the present disclosure.

The RRAM device may operate at 16 conductance states, i.e., state 1, state 2, . . . , state 16, with state 1 being the lowest conductance 30 μS, and state 16 being the highest conductance 180 μS. In graph 400a, the Y-axis represents the standard deviations (also referred to as "STDEV" or "σ") for each conductance state, a measure of the spread or dispersion of the conductance state's conductance values around the mean conductance value of the conductance state. The X-axis is the natural logarithmic time in days at 85° C. The STDEV in Y-axis is the average standard deviation in μS from multiple chips involved in the test with each chip having its own standard deviation. A higher STDEV or σ indicates higher variability and potential reliability issues. Graph 400a shows a clear indication in STDEVs for these conductance states over time. Low conductance states have higher σ and higher slope, while high conductance states have lower σ and lower slope. This also suggests that the variability within these low-conductance states increases approximately logarithmically with time, indicative of worsening reliability under prolonged exposure to high temperatures.

For the low conductance states (e.g., states 1-6), σ may be determined based on the following equation:

$$\sigma = a + b \ln(t). \tag{1}$$

In equation (1), a is the intercept when t=1, and b is the slope. The rate of the changes of the standard deviations (σ) over time may be determined as follows:

$$d\sigma/dt = b/t. \tag{2}$$

Accordingly, the rate of the changes of the standard deviations (G) over time is approximately proportional to 1/t, with b being the proportional constant. The change rate diminishes over time, suggesting that conductance states with increasing σ become less reliable under high-temperature conditions due to increasing variability.

For high conductance states (e.g., states 13-16), the value of σ is approximately constant over time, indicating that the rate of change (dσ/dt) for high conductance states is approximately zero.

Figure 4B:
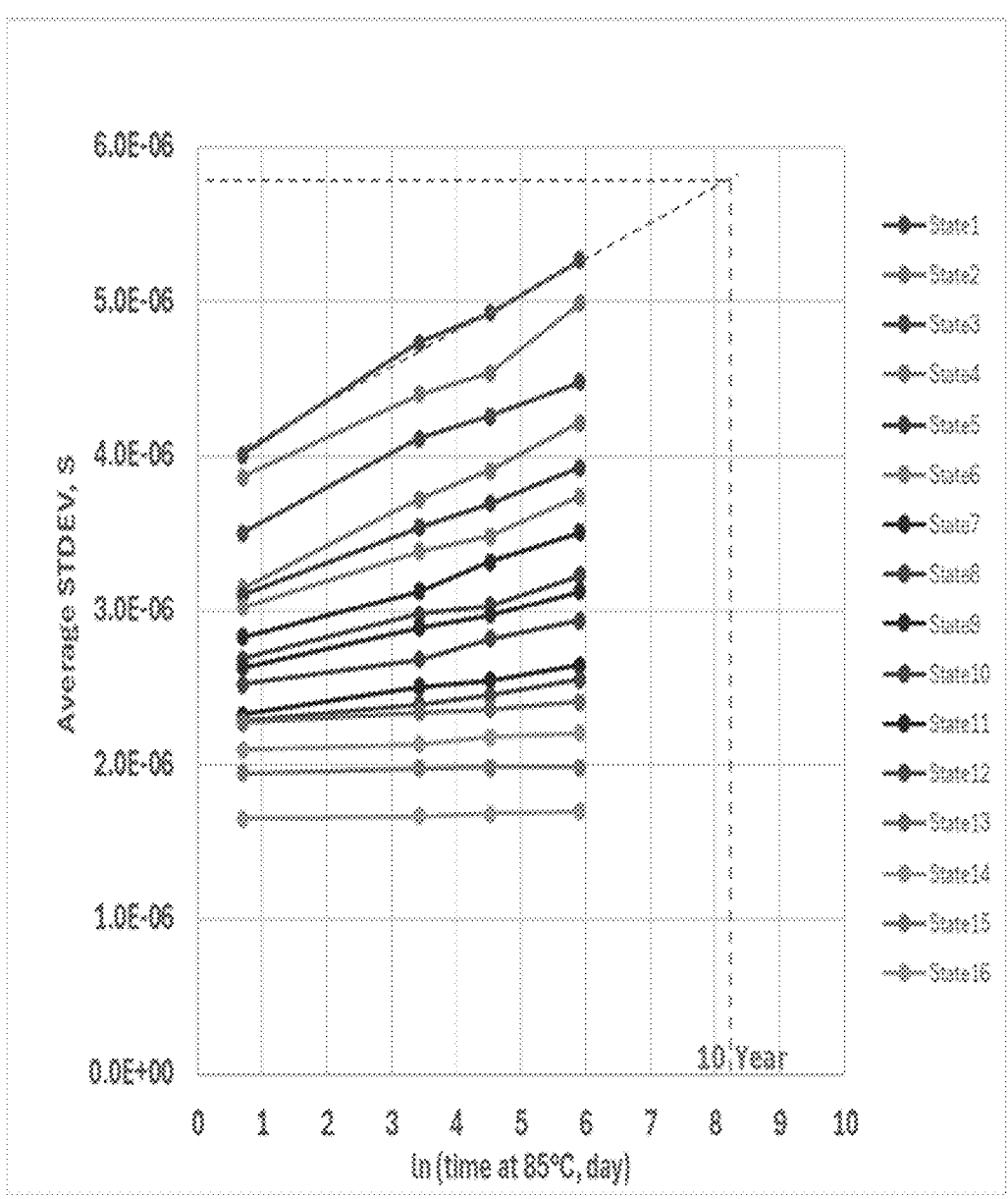
FIG. 4B is a graph illustrating an example method for extrapolation of deviation values based on the historical retention data illustrated in FIG. 4A.

FIG. 4B is a graph 400b illustrating an example method for extrapolating deviation values from the historical retention data in graph 400a using linear regression in accordance with some embodiments of the present disclosure.

The standard deviation for each conductance state over time at 85° C. after 10 years of operation of the RRAM device may be predicted using a linear regression model. For example, the data of the same conductance state in graph 400a of FIG. 4A may be evaluated using the linear regression model and extrapolated to the desired time. The linear regression model may involve evaluating past performance data of the memory system to determine the rate of change (slope) and the initial condition (intercept) of the deviation values over time. In some embodiments, a logarithmic model where sigma is expressed as a function of the natural logarithm of time in days may be used to predict and/or extrapolate the values of the standard deviations to the desired time. For example, the standard deviation of state 1 (30 μS conductance value) at 85° C. after 10 years of operation of the RRAM device may be predicted as follows:

$$\sigma(\mu S) = 3.866 + 0.2401 \ln(\text{days}) \approx 5.80 \, \mu S. \tag{3}$$

FIG. 5A depicts a table 500a showing memory windows between adjacent conductance states of a prior art RRAM device.

As shown, the prior art RRAM device may operate at four conductance states, centering at 30 μS, 80 μS, 130 μS, and 180 μS, respectively, with an equal MW0 of 50 μS between adjacent states. The memory windows MW1 between the adjacent states are 0.74 μS, 15.94 μS, and 27.45 μS, respectively. As such, MW1 between the first memory state and the second memory state is vanishing and may cause retention failures. The reasons for the retention failure between the first conductance state and the second conductance state are (1) the higher σ and higher rate of change in σ with time, and (2) the use of equal memory windows MW1 for different conductance states.

FIG. 5B is a table 500b illustrating memory windows between adjacent conductance states of a memory device with variable memory windows in accordance with some embodiments of the present disclosure.

As shown, the RRAM device may operate at four conductance states, centering at 30 $\mu$S, 90 $\mu$S, 140 $\mu$S, and 180 $\mu$S, respectively. The memory window $MW0_{1-2}$ representative of a distance between the mean conductance value of the first conductance state and the mean conductance value of the second conductance state is 60 $\mu$S. The memory window $MW0_{2-3}$ that represents a distance between the mean conductance value of the second conductance state and the mean conductance value of the third conductance state is 50 $\mu$S. The memory window $MW0_{3-4}$ representative of a distance between the mean conductance value of the third conductance state and the mean conductance value of the fourth conductance state is 40 $\mu$S. The memory window $MW0_{1-2}$ is not equal to and is greater than the memory window $MW0_{3-4}$. The memory windows $MW0_{1-2}$ and $MW0_{3-4}$ are of different values. As such, the RRAM device has variable memory windows MW0.

The memory window MW1 representative of a gap between the first conductance state and the second conductance state is 11.85 $\mu$S. The memory window MW1 representative of a gap between the second conductance state and the third conductance state is 17.75 $\mu$S. The memory window MW1 representative of a gap between the third conductance state and the fourth conductance state is 18.15 $\mu$S. Compared to prior art device the equal memory windows MW0, as described in connection with FIG. 5A, the RRAM device with variable memory windows MW0 can operate in the same conductance range but has an adequate MW1 between the first conductance state and the second conductance state, resulting in good memory retention.

Figure 6:
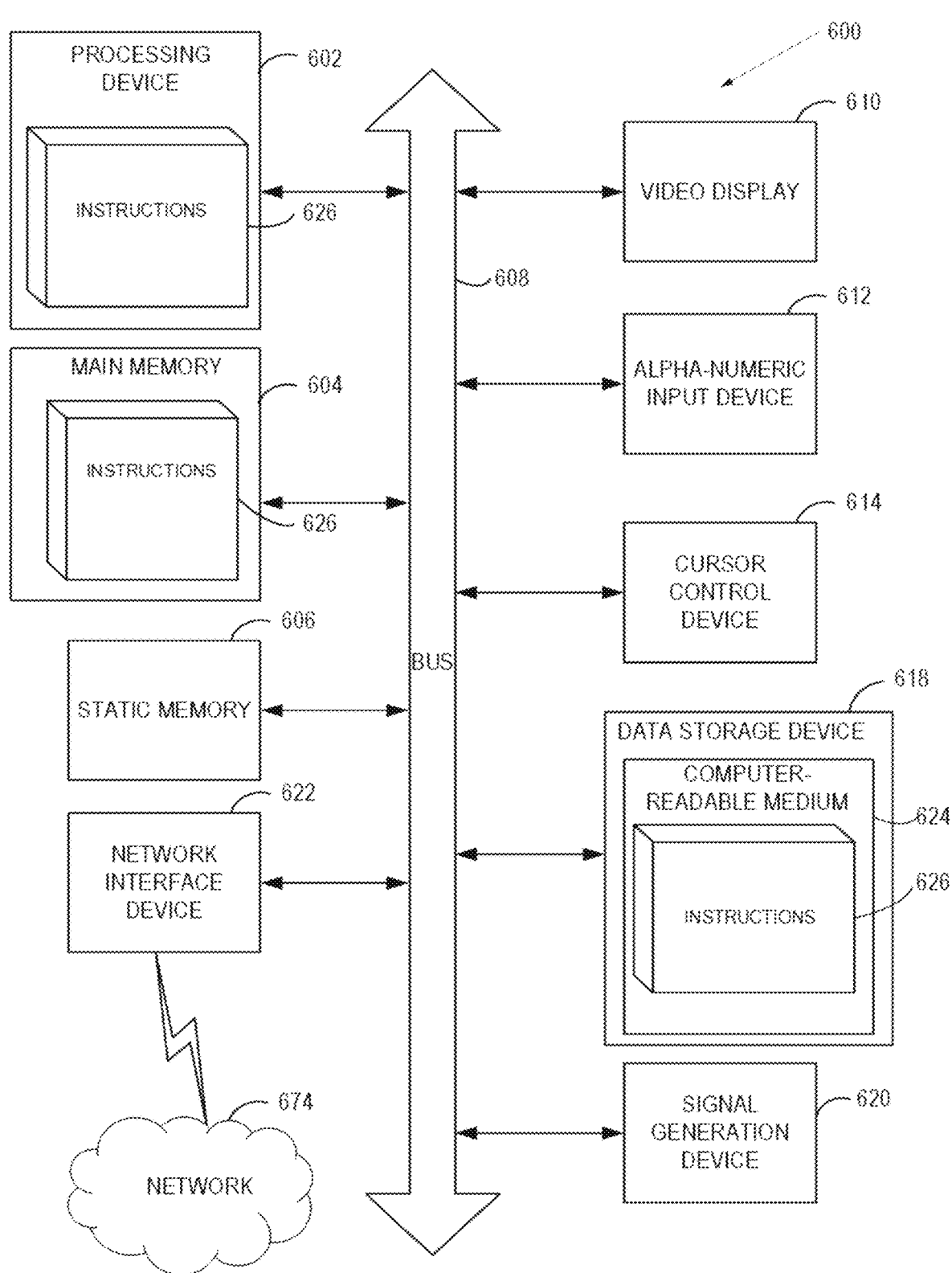
FIG. 6 illustrates a diagrammatic representation of a machine in the exemplary form of a computer system in accordance with some embodiments of the present disclosure.

FIG. 6 illustrates a diagrammatic representation of a machine in the exemplary form of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server or a client machine in client-server network environment or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential, parallel, or in any other suitable sequential order) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 600 includes a processing device (processor) 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage device 618, which communicate with each other via a bus 608.

Processing device 602 represents one or more general-purpose processing devices such as a microprocessor, central processing unit, graphic processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application-specific integrated circuit (ASIC), a field programmable gate array (FPGA), a digital signal processor (DSP), a network processor, or the like. The processing device 602 is configured to execute instructions 626 for performing the operations and steps discussed herein.

The computer system 600 may further include a network interface device 622. The computer system 600 also may include a video display unit 610 (e.g., a liquid crystal display (LCD), a cathode ray tube (CRT), or a touch screen), an alphanumeric input device 612 (e.g., a keyboard), a cursor control device 614 (e.g., a mouse), and a signal generation device 620 (e.g., a speaker).

The data storage device 618 may include a computer-readable storage medium 624 on which is stored one or more sets of instructions 626 (e.g., software) embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting computer-readable storage media. Instructions 626 may further be transmitted or received over a network 674 via the network interface device 622.

In one embodiment, instructions 626 include instructions for implementing a processing device for executing process 200 of FIG. 2, which may correspond to controller 150 described with respect to FIG. 1, and/or a software library containing methods as described in connection with FIG. 2. While the computer-readable storage medium 624 is shown in an exemplary implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding, or carrying a set of instructions for execution by the machine and that causes the machine to perform any one or more of the methodologies of the present disclosure. The term "computer-readable storage medium" shall accordingly be taken to include, but not be limited to, solid-state memories, optical media, and magnetic media.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10, and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method for programming a multilevel memory device, the method comprising:
   determining a first plurality of memory windows representative of gaps between dispersions of adjacent conductance states of the multilevel memory device;
   determining, by a processing device, a plurality of dispersion parameters representative of estimated dispersions of the conductance states; and
   determining, by the processing device, a second plurality of memory windows based on the first plurality of memory windows and the plurality of dispersion parameters, wherein a first memory window of the second plurality of memory windows represents a separation between a mean conductance value of a first conductance state of the multilevel memory device and a mean conductance value of a second conductance state of the multilevel memory device, wherein a second memory window of the second plurality of memory windows represents a separation between a mean conductance value of a third conductance state and a mean conductance value of a fourth conductance state of the multilevel memory device, wherein the first memory window and the second memory window are of different values.

2. The method of claim 1, wherein the first plurality of memory windows comprises a third memory window corresponding to a first gap between a first dispersion of the first conductance state and a second dispersion of the second conductance state of the multilevel memory device, wherein the first memory window is determined based on the third memory window, a first dispersion parameter representative of an estimated dispersion of the first conductance state, and a second dispersion parameter representative of an estimated dispersion of the second conductance state.

3. The method of claim 2, wherein determining the plurality of dispersion parameters comprises determining the first dispersion parameter by predicting a first deviation value representative of variability of conductance values of the first conductance state and determining a scaled value of the first deviation value.

4. The method of claim 3, wherein determining the plurality of dispersion parameters comprises determining the second dispersion parameter by predicting a second deviation value representative of variability of conductance values of the second conductance state and determining a scaled value of the second deviation value.

5. The method of claim 3, wherein predicting the first deviation value comprises extrapolation of historical retention data using linear regression.

6. The method of claim 2, wherein the first plurality of memory windows comprises a fourth memory window corresponding to a second gap between a third dispersion of the third conductance state and a fourth dispersion of the fourth conductance state of the multilevel memory device, wherein the second memory window is determined based on the fourth memory window, a third dispersion parameter representative of an estimated dispersion of the third conductance state, and a fourth dispersion parameter representative of an estimated dispersion of the fourth conductance state.

7. The method of claim 1, further comprising:
   comparing a sum of the second plurality of memory windows with a conductance range of the multilevel memory device; and
   adjusting, by the processing device, at least one of the conductance range or the number of the conductance states based on the comparison.

8. The method of claim 7, wherein adjusting the number of the conductance states based on the comparison comprises increasing the number of the conductance states in response to determining that the sum of the second plurality of memory windows is less than the conductance range.

9. The method of claim 8, wherein adjusting the number of the conductance states based on the comparison comprises decreasing the number of the conductance states in response to determining that the sum of the second plurality of memory windows is greater than the conductance range.

10. The method of claim 7, further comprising programming the multilevel memory device according to the conductance states in response to determining that a difference between the sum of the second plurality of memory windows and the conductance range of the multilevel memory device is not greater than a predetermined threshold.

11. A crossbar circuit, comprising:
a plurality of interconnecting electrically conductive lines;
at least one memory device connected to the electrically conductive lines; and
a controller configured to:
    determine a first plurality of memory windows representative of gaps between adjacent conductance state dispersions of the memory device;
    determine a plurality of dispersion parameters representative of estimated dispersions of the conductance states; and
    determine a second plurality of memory windows based on the first plurality of memory windows and the plurality of dispersion parameters, wherein a first memory window of the second plurality of memory windows represents a separation between a mean conductance value of a first conductance state of the memory device and a mean conductance value of a second conductance state of the memory device, wherein a second memory window of the second plurality of memory windows represents a separation between a mean conductance value of a third conductance state and a mean conductance value of a fourth conductance state of the memory device, wherein the first memory window and the second memory window are of different values.

12. The crossbar circuit of claim 11, wherein the first plurality of memory windows comprises a third memory window corresponding to a first gap between a first dispersion of the first conductance state and a second dispersion of the second conductance state of the memory device, wherein the first memory window is determined based on the third memory window, a first dispersion parameter representative of an estimated dispersion of the first conductance state, and a second dispersion parameter representative of an estimated dispersion of the second conductance state.

13. The crossbar circuit of claim 12, wherein, to determine the plurality of dispersion parameters, the controller is further to determine the first dispersion parameter by predicting a first deviation value representative of variability of conductance values of the first conductance state and determining a scaled value of the first deviation value.

14. The crossbar circuit of claim 13, wherein, to determine the plurality of dispersion parameters, the controller is further to determine the second dispersion parameter by predicting a second deviation value representative of variability of conductance values of the second conductance state and determining a scaled value of the second deviation value.

15. The crossbar circuit of claim 13, wherein, to predict the first deviation value, the controller is to perform extrapolation of historical retention data using linear regression.

16. The crossbar circuit of claim 12, wherein the first plurality of memory windows comprises a fourth memory window corresponding to a second gap between a third dispersion of the third conductance state and a fourth dispersion of the fourth conductance state of the memory device, wherein the second memory window is determined based on the fourth memory window, a third dispersion parameter representative of an estimated dispersion of the third conductance state, and a fourth dispersion parameter representative of an estimated dispersion of the fourth conductance state.

17. The crossbar circuit of claim 11, wherein the controller is further to:
compare a sum of the second plurality of memory windows with a conductance range of the memory device; and
adjust at least one of the conductance range or the number of the conductance states based on the comparison.

18. The crossbar circuit of claim 17, wherein, to adjust the number of the conductance states based on the comparison, the controller is further to increase the number of the conductance states in response to determining that the sum of the second plurality of memory windows is less than the conductance range.

19. The crossbar circuit of claim 18, wherein, to adjust the number of the conductance states based on the comparison, the controller is further to decrease the number of the conductance states in response to determining that the sum of the second plurality of memory windows is greater than the conductance range.

20. The crossbar circuit of claim 17, wherein the memory device comprises at least one of a phase-change memory (PCM) device, a floating gate device, a spintronic device, a ferroelectric device, or a resistive random-access memory (RRAM or ReRAM) device.

* * * * *